(12) United States Patent
Kim et al.

(10) Patent No.: US 12,094,420 B2
(45) Date of Patent: Sep. 17, 2024

(54) GATE DRIVING CIRCUIT AND DISPLAY DEVICE INCLUDING THE SAME

(71) Applicant: LG DISPLAY CO., LTD., Seoul (KR)

(72) Inventors: Kyu Jin Kim, Paju-si (KR); Moon Soo Chung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/952,454

(22) Filed: Sep. 26, 2022

(65) Prior Publication Data

US 2023/0096265 A1 Mar. 30, 2023

(30) Foreign Application Priority Data

Sep. 30, 2021 (KR) .................. 10-2021-0130033

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2320/0233* (2013.01)

(58) Field of Classification Search
CPC .. G09G 3/3266; G09G 3/3233; G09G 3/3275; G09G 2300/0426; G09G 2300/0819; G09G 2300/0842; G09G 2300/0861; G09G 2310/0286; G09G 2310/0291; G09G 2310/06; G09G 2320/0233; G09G 5/008; G11C 19/28

See application file for complete search history.

(56) References Cited

U.S. PATENT DOCUMENTS

| | | | |
|---|---|---|---|
| 10,559,261 B2* | 2/2020 | Chang | H10K 59/1213 |
| 11,238,809 B2* | 2/2022 | Park | G11C 19/28 |
| 2018/0144674 A1* | 5/2018 | Gupta | G09G 3/3233 |
| 2019/0035322 A1* | 1/2019 | Kim | G09G 3/3233 |
| 2020/0184898 A1* | 6/2020 | Choi | G09G 3/3233 |
| 2021/0166630 A1* | 6/2021 | Kim | G09G 3/3258 |
| 2021/0225256 A1* | 7/2021 | Byun | G09G 3/20 |
| 2021/0280136 A1* | 9/2021 | Shin | H10K 59/1213 |
| 2022/0076609 A1* | 3/2022 | Feng | G09G 3/2092 |
| 2022/0327980 A1* | 10/2022 | Lai | G09G 3/3266 |
| 2022/0343857 A1* | 10/2022 | Choi | G09G 3/3266 |
| 2023/0005430 A1* | 1/2023 | Li | G09G 3/2096 |
| 2023/0075449 A1* | 3/2023 | Ji | G11C 19/28 |

(Continued)

FOREIGN PATENT DOCUMENTS

KR 10-2020-0015874 A 2/2020

*Primary Examiner* — Christopher E Leiby
(74) *Attorney, Agent, or Firm* — Morgan, Lewis & Bockius LLP

(57) ABSTRACT

Provided are a gate driving circuit and a display device including the same. The gate driving circuit includes a first outputter for outputting a first scan pulse that swings between a gate-on voltage and a first gate-off voltage, a second outputter for outputting a second scan pulse that swings between the gate-on voltage and a second gate-off voltage, and a controller for controlling the first and second outputters. The first gate-off voltage is set to be higher or lower than the second gate-off voltage.

23 Claims, 8 Drawing Sheets

(56) References Cited

U.S. PATENT DOCUMENTS

2023/0148117 A1* 5/2023 Feng .................. G11C 19/28
345/214
2023/0162637 A1* 5/2023 Liu .................. G09G 3/3677
345/214

* cited by examiner

GATE DRIVING CIRCUIT AND DISPLAY DEVICE INCLUDING THE SAME

CROSS-REFERENCE TO RELATED APPLICATION

This application claims priority to and the benefit of Korean Patent Application No. 10-2021-0130033, filed on Sep. 30, 2021, the disclosure of which is incorporated herein by reference in its entirety.

BACKGROUND

1. Technical Field

The present disclosure relates to a gate driving circuit and a display device including the same.

2. Discussion of the Related Art

An electroluminescence display device may include an inorganic light emitting display device and an organic light emitting display device according to the material of the emission layer. The active matrix type organic light emitting display device includes an organic light emitting diode (hereinafter, referred to as "OLED") that emits light by itself, and has the advantage of fast response speed, high light-emitting efficiency, high luminance and wide viewing angle. In the organic light emitting display device, the OLED (Organic Light Emitting Diode) is formed in each pixel. The organic light emitting display device has a fast response speed, excellent light-emitting efficiency, luminance, and viewing angle, and has also excellent contrast ratio and color reproducibility because black gray scale can be expressed as complete black.

A pixel circuit of the organic light emitting display device may include an light emitting element (OLED) used as a light-emitting element, a driving element for driving the OLED, a capacitor for storing a gate-source voltage of the driving element, and a plurality of switch elements. In the pixel circuit, leakage current may occur through a switch element that is in an off state and is connected to the capacitor, thus discharging a voltage of the capacitor. Accordingly, luminance and holding characteristics of pixels may decrease.

SUMMARY

Accordingly, embodiments of the present disclosure are directed to a gate driving circuit and a display device including the same that substantially obviate one or more of the problems due to limitations and disadvantages of the related art.

An aspect of the present disclosure to fulfill the above-described necessities and/or solve the above-described problems.

Another aspect of the present disclosure is to provide a gate driving circuit for preventing a decrease of luminance of pixels due to leakage current in switch elements and improving holding characteristics of the pixels, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a gate driving circuit comprises an $(N-1)^{th}$ signal transmitter to which a start pulse or carry signal, a shift clock, a gate-on voltage, a first gate-off voltage, and a second gate-off voltage are applied, wherein N is a natural number; and an $N^{th}$ signal transmitter to which a carry signal from the $(N-1)^{th}$ signal transmitter, the shift clock, the gate-on voltage, the first gate-off voltage, and the second gate-off voltage.

Each of the $(N-1)^{th}$ and $N^{th}$ signal transmitters includes a first outputter configured to output a first scan pulse that swings between the gate-on voltage and the first gate-off voltage, a second outputter configured to output a second scan pulse that swings between the gate-on voltage and the second gate-off voltage, and a controller configured to control the first and second outputters.

The first gate-off voltage is set to be higher or lower than the second gate-off voltage.

A display device according to an embodiment of the present disclosure includes a pixel array including a plurality of data lines, a plurality of gate lines, a plurality of power lines to which a constant voltage is applied, and a plurality of subpixels; a data driver configured to apply a data voltage to the plurality of data lines; and a gate driver configured to sequentially supply scan pulses to the plurality of gate lines using a shift register.

The shift register includes the $(N-1)^{th}$ signal transmitter and the $N^{th}$ signal transmitter.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
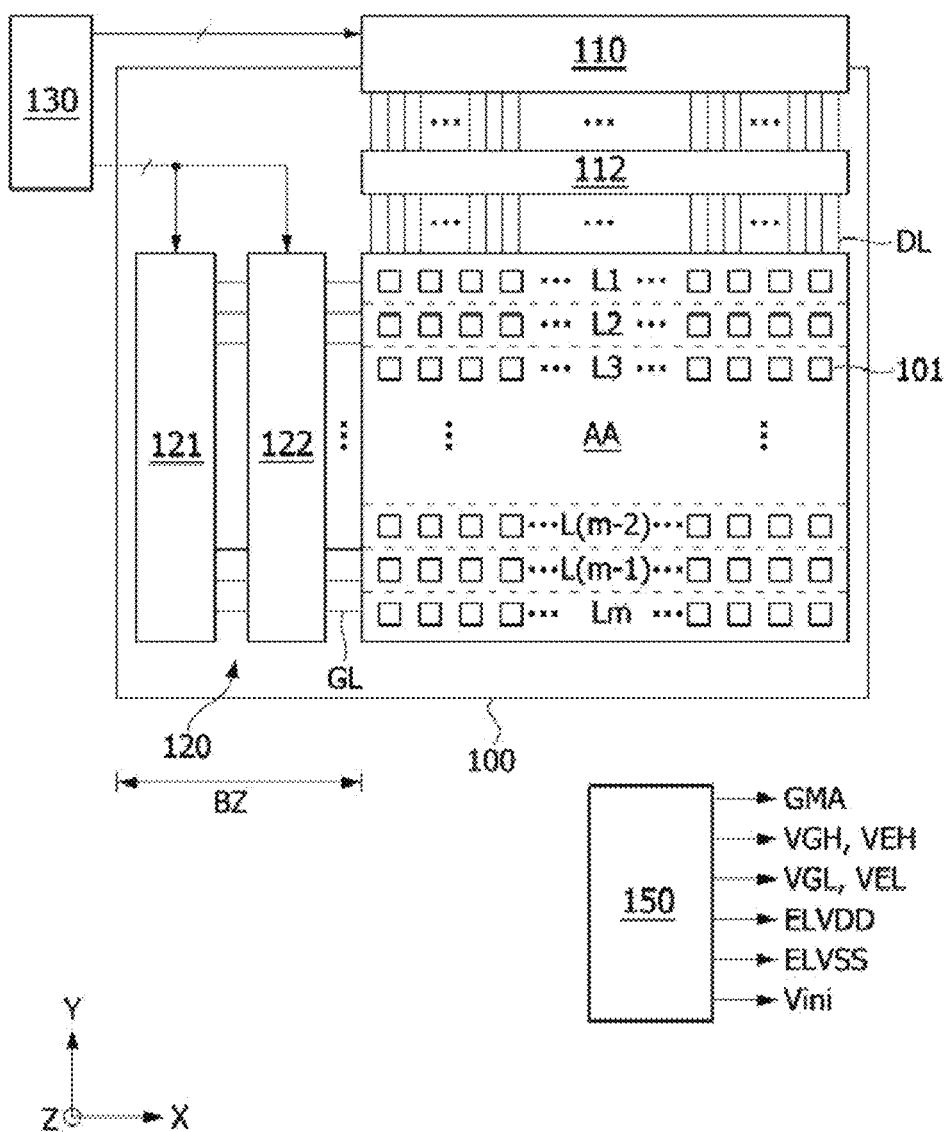
FIG. 1 is a block diagram of a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

Although "first," "second," etc. are used to describe various components in embodiments, the components are not limited by these terms. These terms are only used to distinguish one component from another. Therefore, a first component described below could be termed a second component without departing from the technical scope of the present disclosure.

The same reference numerals refer to the same components throughout the specification.

Features of various embodiments may be partially or entirely combined with each other or be implemented technically in association with each other in various ways, and embodiments may be implemented independently or together with each other.

A pixel circuit and a gate driving unit formed on a display panel of the present disclosure may include a plurality of transistors. The transistors may each be embodied as an oxide thin-film transistor (TFT) including an oxide semiconductor, a low-temperature poly silicon (LTPS) TFT including LTPS, or the like. Each of the transistors may be embodied as a p-channel TFT or an n-channel TFT.

A transistor is a three-electrode element including a gate, a source, and a drain. The source is an electrode through which carriers are supplied to the transistor. In the transistor, carriers begin to flow from the source. The drain is an electrode through which carriers exit the transistor. In the transistor, carriers flow from the source to the drain. In the case of an n-channel transistor, since carriers are electrons, a source voltage is lower than a drain voltage so that electrons can flow from the source to the drain. In the n-channel transistor, a current flows from the drain to the source. In the case of a p-channel transistor, since carriers are holes, a source voltage is higher than a drain voltage so that holes can flow from the source to the drain. In the p-channel transistor, since holes flow from the source to the drain, a current flows from the source to the drain. It should be noted that the source and drain of the transistor are not fixed. For example, the source and the drain may be changed according to an applied voltage. Accordingly, the present disclosure is not limited by the source and drain of the transistor. In the following description, the source and drain of the transistor will be referred to as first and second electrodes.

A gate pulse may swing between a gate on voltage and a gate off voltage. The transistor is turned on in response to the gate-on voltage, and turned off in response to the gate-off voltage. In the case of the n-channel transistor, the gate-on voltage may be a gate high voltage VGH and VEH, and the gate-off voltage may be a gate low voltage VGL and VEL.

Hereinafter, various embodiments of the present disclosure will be described in detail with reference to the accompanying drawings. In the following embodiments, the display device will be mainly described as an organic light emitting display device, but the present disclosure is not limited thereto.

Figure 2:
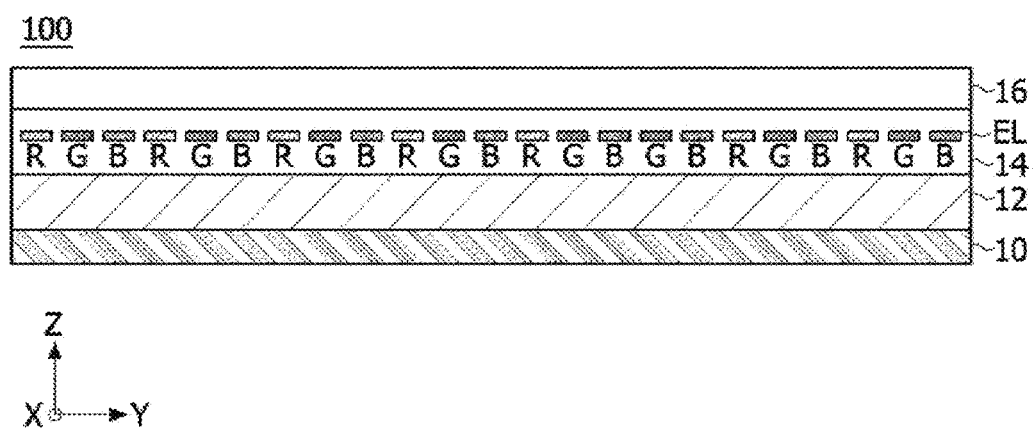
FIG. 2 is a cross-sectional view of a display panel as shown in FIG. 1.

Referring to FIGS. 1 and 2, a display device according to an embodiment of the present disclosure includes a display panel 100, display panel drivers 110 and 120 for writing pixel data of an input image to pixels of the display panel 100, a timing controller 130 for controlling the display panel drivers 110 and 120, and a power supply 150 for generating power necessary to drive the display panel 100.

The display panel 100 includes a pixel array AA that displays an input image on a screen. The pixel array AA includes a plurality of data lines DL, a plurality of gate lines GL crossing the data lines DL, power lines for applying a constant voltage (or a direct-current (DC) voltage), and pixels disposed in a matrix defined by the data lines DL and the gate lines GL.

Each of the pixels may be divided into red, green and blue subpixels 101 to realize colors. Each of the pixels may further include a white subpixel. Each of the subpixels 101 includes a pixel circuit for driving an light emitting element EL. In addition, each of the subpixels 101 may include a color filter but the color filter may be omitted. Hereinafter, a pixel may be understood as having the same meaning as a subpixel.

The display panel 100 has a width in an X-axis direction, a length in a Y-axis direction, and a thickness in a Z-axis direction. The pixel array AA includes a plurality of pixel lines L1 to Ln. A pixel line includes pixels arranged in a line in a row-line direction (the X-axis direction). The pixel array AA includes m pixel lines L1 to Lm (m is natural number). Pixels arranged in a pixel line share gate lines and are connected to different data lines DL. Subpixels 101 arranged vertically in a column direction (the Y-axis direction) share the same data line. In one horizontal period, pixels arranged in a pixel line is charged with a data voltage of pixel data.

Touch sensors may be disposed on the screen of the display panel 100. The touch sensors include on-cell type or add-on type touch sensors disposed on the screen of the display panel 100 or in-cell type touch sensors included in a pixel array AA.

When a cross-sectional structure of the display panel 100 is viewed, the display panel may include the circuit layer 12, the light-emitting element layer 14, and the encapsulation layer 16 that are stacked on a substrate 10.

The circuit layer 12 may include a pixel circuit connected to interconnections such as a data line, a gate line, and a power line, a gate driver (GIP) connected to gate lines, a de-multiplexer array 112, a circuit (not shown) for auto probe inspection, etc. An interconnection and circuit elements of the circuit layer 12 may include a plurality of insulating layers, two or more metal layers separated from each other with the insulating layers therebetween, and an active layer including a semiconductor material.

The light-emitting element layer 14 may include light-emitting elements EL to be driven by the pixel circuit. The light-emitting elements EL may include a red (R) light-emitting element, a green (G) light-emitting element, and a blue (B) light-emitting element. The light-emitting element layer 14 may include a white light-emitting element and a color filter. The light-emitting elements EL of the light-emitting element layer 14 may be covered with a protective layer.

The encapsulation layer 16 covers the light-emitting element layer 14 to seal the circuit layer 12 and the light-emitting element layer 14. The encapsulation layer 16 may be a multi-insulating film structure in which an organic film and an inorganic film are alternately stacked. The inorganic film blocks infiltration of moisture or oxygen. The organic film planarizes a surface of the inorganic film. When the organic film and the inorganic film are stacked in multiple layers, a penetration path of moisture or oxygen is longer than that of a single layer and thus the infiltration of moisture and oxygen that may influence the light-emitting element layer 14 may be effectively blocked.

A touch sensor layer may be disposed on the encapsulation layer 16. The touch sensor layer may include capacitance touch sensors that sense a touch input on the basis of a change in capacitance before and after the touch input is input. The touch sensor layer may include metal interconnection patterns and insulating films that form a capacitance of touch sensors. A capacitance of a touch sensor may be formed between metal interconnection patterns. A polarizing plate may be disposed on the touch sensor layer. The polarizing plate may convert polarization of external light reflected from the metals of the touch sensor layer and the circuit layer 12 to improve visibility and a contrast ratio. The polarizing plate may be embodied as a polarizing plate in which a linear polarizing plate and a phase-delay film are bonded with each other, or circular polarizing plate. Cover glass may be glued onto the polarizing plate.

The display panel 100 may further include a touch sensor layer and a color filter layer stacked on the encapsulation layer 16. The color filter layer may include red, green, and blue color filters and a black matrix pattern. The color filter layer may absorb a part of a wavelength of light reflected from the circuit layer and the touch sensor layer instead of the polarizing plate and increase color purity. In the present embodiment, the color filter layer 20 having a higher transmittance than that of a polarizing plate is applied to the display panel 100 to improve light transmittance, improving a thickness and flexibility of the display panel 100. Cover glass may be glued onto the color filter layer.

The display panel 100 may be embodied as a flexible display panel in which pixels are arranged on a flexible substrate such as a plastic substrate or a metal substrate. A size and shape of a screen of the flexible display may be changed by rolling, folding or bending a flexible display panel thereof. Flexible displays may include slidable displays, rollable displays, bendable displays, foldable displays, etc.

Due to a device characteristic deviation and a process deviation in a manufacturing process of the display panel 100, electrical characteristics of driving elements of pixels may be different and the difference may increase as a driving time of the pixels increases. To compensate for a deviation between the electrical characteristics of the driving element of the pixels, an internal or external compensation technique may be applied to an organic light-emitting display device.

In the internal compensation technique, a threshold voltage of a driving element of each subpixel is sensed using an internal compensation circuit included in each pixel and a gate-source voltage Vgs of the driving element is compensated for by the threshold voltage. In the external compensation technique, a current or voltage of a driving element that changes according to electrical characteristics of the driving element is sensed in real time using an external compensation circuit. In the external compensation technique, pixel data (digital data) of an input image is modified by an electrical characteristic deviation (or change) of the driving element, which is sensed in units of pixels, to compensate for the electrical characteristic deviation (or change) of the driving element of each pixel in real time.

A display panel driver may drive pixels using the internal compensation technique and/or the external compensation technique.

The display panel driver writes pixel data of an input image to the subpixels 101 to reproduce the input image on the screen of the display panel 100. The display panel driver includes the data driver 110 and the gate driver 120. The display panel driver may further include a demultiplexer 112 between the data driver 110 and the data lines DL.

The display panel driver may operate in a low-speed driving mode under control of the timing controller 130. In the low-speed driving mode, an input image may be analyzed and power consumption of a display device may be reduced when there is no change in the input image for a predetermined time. In the low-speed driving mode, when still images are input for a certain time period or more, a refresh rate of pixels may be reduced to increase a data write period of the pixels, thereby reducing power consumption. The low-speed driving mode is not limited to a case in which still images are input. For example, a display panel driving circuit may operate in the low-speed driving mode when the display device operates in a standby mode or when a user command or an input image is not input to the display panel driving circuit for a certain time.

The data driver 110 receives pixel data of an input image in the form of a digital signal from the timing controller 130. The data driver 110 generates a data voltage by converting the pixel data of the input image into a gamma compensation voltage using a digital-to-analog converter (hereinafter referred to as "DAC"). The data driver 110 may include a voltage divider circuit that outputs a gamma compensation voltage. The voltage divider circuit divides a gamma reference voltage GMA from the power supply 150 into gamma compensation voltages in units of gradation levels and provides the gamma compensation voltages to the DAC. Data voltages output from channels of the data driver 110 may be applied to the data lines DL of the display panel 100 through the demultiplexer 112.

The demultiplexer 112 distributes the data voltages output through channels of the data driver 110 to the data lines DL by time division. The number of channels of the data driver 110 may decrease due to the demultiplexer 112. The demultiplexer 112 may be omitted. In this case, the channels of the data driver 110 are directly connected to the data lines DL.

The gate driver 120 may be embodied as a gate-in-panel (GIP) circuit formed on a circuit layer 12 on the display panel 100, together with a TFT array of the pixel array AA. The GIP circuit may be disposed in a bezel area BZ of the display panel 100 or at least a part of the GIP circuit may be distributively disposed in the pixel array AA.

The gate driver 120 sequentially outputs a gate signal to the gate lines GL under control of the timing controller 130. The gate driver 120 may shift the gate signal using a shift register and sequentially supply resultant signals to the gate lines GL. A voltage of the gate signal swings between a gate-off voltage VGH and a gate-on voltage VGL. The gate signal may include a scan pulse and a light emission control pulse (hereinafter referred to as "EM pulse") for control of light emission times of pixels. Gate lines include gate lines to which a scan pulse is applied and gate lines to which an EM pulse is applied. Gate-on voltages of the scan pulse and the EM pulse may be set to be the same voltage or different voltages. In addition, gate-off voltages of the scan pulse and the EM pulse may be set to be the same voltage or different voltages. Gate lines may be divided into scan lines to which scan pulses are sequentially input and EM lines to which EM pulses are sequentially input.

The gate driver 120 may be disposed in left and right bezels of the display panel 100 to supply a gate signal to the gate line GL by a double feeding method. In the double feeding method, gate drivers 120 at opposite sides may be synchronized with each other to simultaneously supply gate signals to opposite ends of one gate line. In another embodiment, the gate driver 120 may be disposed at a side of the left or right bezel of the display panel 100 to supply gate signals to the gate lines GL by a single feeding method.

The gate driver 120 may include a first gate driver 121 and a second gate driver 122. The first gate driver 121 outputs a scan pulse using a first shift register and shifts the scan pulse in response to a shift clock. The second gate driver 122 outputs an EM pulse using a second shift register and shifts the EM pulse in response to a shift clock.

The timing controller 130 receives, from a host system, pixel data of an input image and a timing signal to be synchronized with the pixel data. The timing signal may include a vertical synchronization signal Vsync, a horizontal synchronization signal Hsync, a clock CLK, a data enable signal DE, etc. One period of the vertical synchronization signal Vsync is one frame period. One period of each of the horizontal synchronization signal Hsync and the data enable signal DE is one horizontal period 1H. A pulse of the data enable signal DE is synchronized with one-line data to be written to pixels in a pixel line. A frame period and a horizontal period may be identified by a method of counting the data enable signal DE and thus the vertical synchronization signal Vsync and the horizontal synchronization signal Hsync may be omitted.

Examples of the host system may include a television (TV) system, a navigation system, a personal computer (PC), a tablet/laptop computer, a vehicle system, a mobile system, and a main circuit board of a wearable system. In the mobile system or wearable system, the timing controller 130, the data driver 110, and the power supply 150 may be integrated in one drive integrated circuit (IC).

The timing controller 130 may control operation timing of the display panel drivers 110, 112 and 120 using a frame frequency corresponding to an input frame frequency Hz multiplied by i (i is a positive integer greater than 0). The input frame frequency is 60 Hz according to the National Television Standards Committee (NTSC) standard or is 50 Hz in the Phase-Alternating Line (PAL) standard. The timing controller 130 may reduce a frame frequency to a frequency between 1 Hz to 30 Hz to lower a refresh rate of pixels in the low-speed driving mode.

The timing controller 130 generates a data timing control signal for controlling an operation timing of the data driver 110, a switch control signal for controlling an operation timing of the demultiplexer 112, and a gate timing control signal for controlling an operation timing of the gate driver 120, based on the timing signals Vsync, Hsync, and DE received from the host system.

Examples of the gate timing control signal may include a start pulse, a shift clock, etc. A voltage of a gate timing control signal output from the timing controller 130 may be applied to the gate driver 120 by being converted into a gate-off voltage VGH/VEH and a gate-on voltage VGL/VEL through a level shifter (not shown). The level shifter converts a low-level voltage of the gate timing control signal into the gate-on voltages VGL and a high-level voltage of the gate timing control signal into the gate-off voltage VGH.

Examples of the power supply 150 may include a charge pump, a regulator, a buck converter, a boost converter, a programmable gamma IC (P-GMA IC), and the like. The power supply 150 generates a constant voltage (or DC voltage) necessary to driving the display panel driver and the display panel 100 by adjusting a DC input voltage from a host system. The power supply 150 may output a constant voltage such as a gamma reference voltage, the gate-off voltage VGH/VEH, the gate-on voltage VGL/VEL, a pixel driving voltage ELVDD, a low-potential power supply voltage ELVSS or an initialization voltage Vini. The P-GMA IC may change the gamma reference voltage according to register settings. The gamma reference voltage GMA is applied to the data driver 110. The gate-off voltage VGH/VEH and the gate-on voltage VGL/VEL are applied to the level shifter and the gate driver 120. A gate-off voltage VGH of a scan pulse may be divided into first and second gate-off voltages which are different voltages. The pixel driving voltage ELVDD, the low-potential power supply voltage ELVSS, and the initialization voltage Vini are commonly applied to pixel circuits through power lines. The pixel driving voltage ELVDD may be set to be higher than the initialization voltage Vini, and the low-potential power supply voltage VSS may be set to be equal to or less than the initialization voltage Vini.

Figure 3:
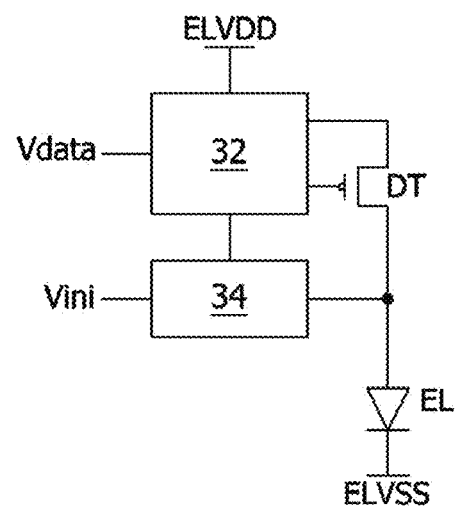
FIG. 3 is a circuit diagram of a pixel circuit according to an embodiment of the present disclosure.

FIG. 3 is a circuit diagram of a pixel circuit according to a first embodiment of the present disclosure.

Referring to FIG. 3, the pixel circuit includes an OLED EL, a driving element DT for supplying current to the OLED EL, a first driver 32 connected to the driving element DT, and a second driver 34 connected to the first driver 32.

The OLED EL may include an anode electrode, a cathode electrode, and an organic compound layer connected between the anode electrode and the cathode electrode. The organic compound layer may include, but is not limited to, a hole injection layer (HIL), a hole transport layer (HTL), an emission layer (EML), an electron transport layer (ETL), and an electron injection layer (EIL). When voltages of opposite ends of the OLED EL are greater than or equal to a threshold voltage of the OLED EL, the OLED EL is turned on, thus causing current to flow through the OLED EL. In this case, visible light may be emitted as holes flowing through the HTL and electrons flowing through the ETL move to the EML, thus generating excitons at the EML. An light emitting element EL used as the light-emitting element EL may be of a tandem structure in which a plurality of light-emitting layers are stacked. An OLED of the tandem structure can improve the luminance and lifespan of pixels.

The driving element DT supplies current to the OLED EL according to a gate-source voltage Vgs to drive the OLED EL.

The first driver 32 includes a capacitor connected to a gate electrode of the driving element DT and one or more switch elements. A data voltage Vdata of pixel data and a pixel driving voltage ELVDD are applied to the first driver 32. The first driver 32 samples a threshold voltage Vth of the driving element DT, stores the threshold voltage Vth in the capacitor, and charges the capacitor with the data voltage Vdata. The capacitor may be charged with a data voltage compensated for by the threshold voltage Vth of the driving element DT.

The second driver 34 includes one or more switch elements. An initialization voltage Vini is applied to the second driver 34. The second driver 34 applies the initialization voltage Vini to the first driver 32 and the anode electrode of the OLED EL to initialize the capacitor of the first driver 32 and an anode voltage of the OLED EL.

Each of the switch elements of the driving element DT and the first and second drivers 32 and 34 may be embodied as a transistor. The first and second drivers 32 and 34 may be implemented in various ways. For example, the first and second drivers 32 and 34 may be embodied as, but are not limited to, a circuit shown in FIG. 4.

Figure 4:
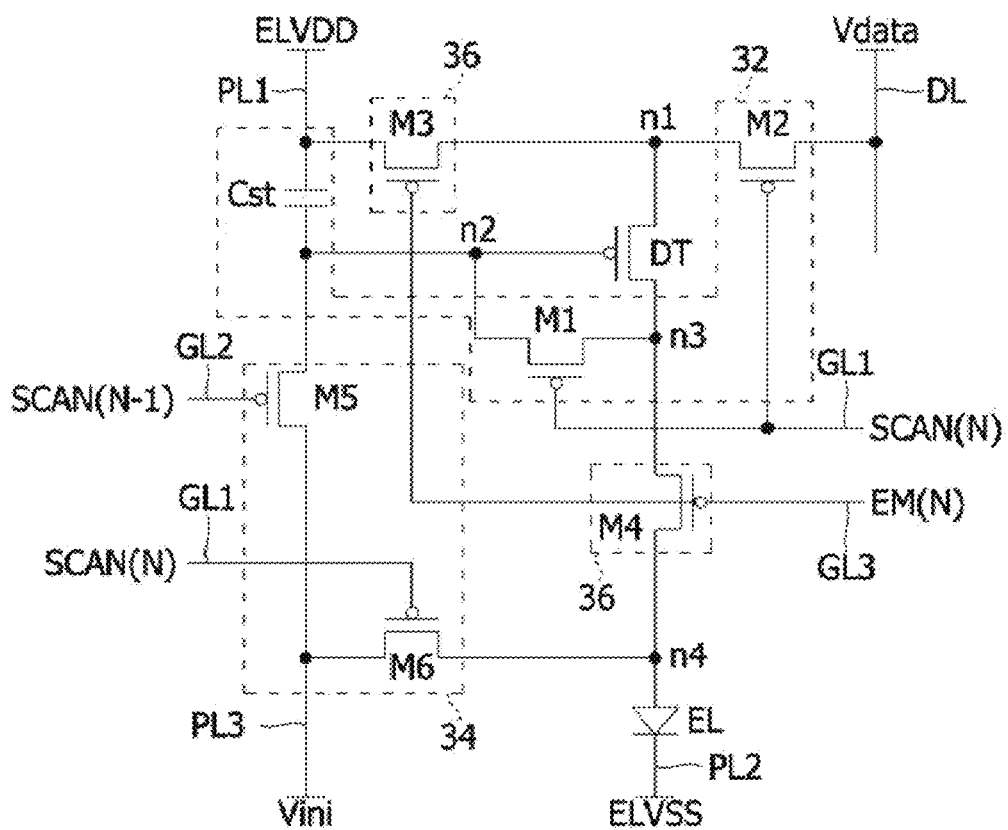
FIG. 4 is a circuit diagram of various pixel circuits applicable to a pixel circuit of the present disclosure.
Figure 5:
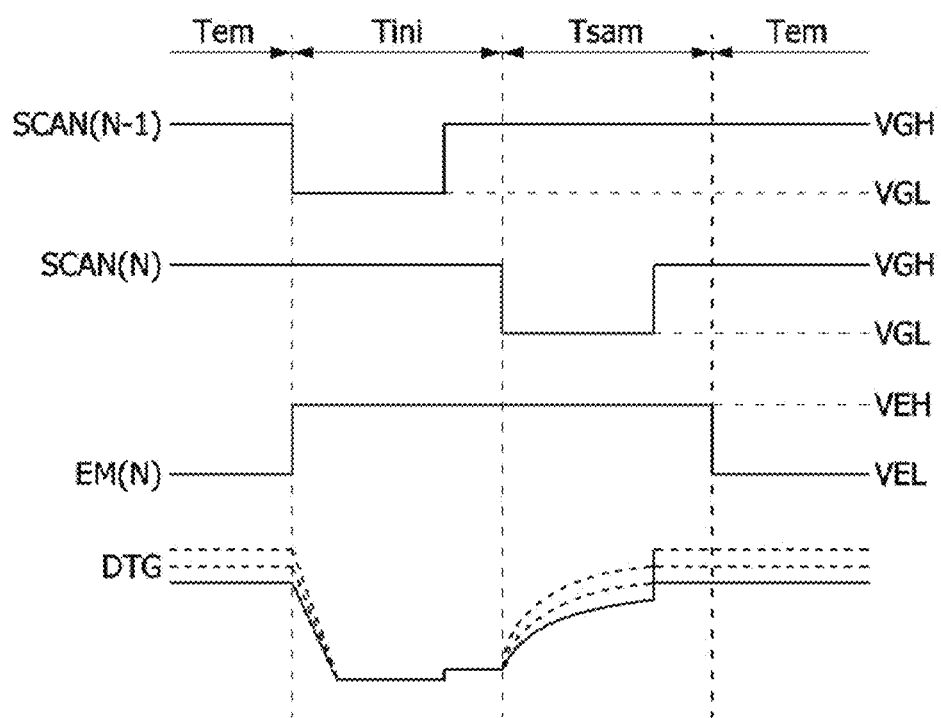
FIG. 5 is a waveform diagram illustrating a driving method of the pixel circuit of FIG. 4.

FIG. 4 is a circuit diagram of an example of a pixel circuit to which an internal compensation circuit is applied. FIG. 5 is a waveform diagram illustrating a driving method of the pixel circuit of FIG. 4.

The pixel circuit of FIG. 4 may be disposed on a subpixel in an $N^{th}$ pixel line (N is a positive integer). The pixel circuit in the $N^{th}$ pixel line is charged with a data voltage Vdata synchronized with an $N^{th}$ scan pulse SCAN(N). A pixel circuit in an $(N-1)^{th}$ pixel line is charged with a data voltage Vdata synchronized with an $(N-1)^{th}$ scan pulse SCAN(N-1) generated prior to the $N^{th}$ scan pulse SCAN(N).

Referring to FIGS. 4 and 5, the pixel circuit includes an OLED EL, a driving element DT for supplying current to the OLED EL, a first driver 32, and a second driver 34.

The first driver 32 may include a capacitor Cst, a first switch element M1, and a second switch element M2. A threshold voltage Vth of the driving element DT is sampled and stored in the capacitor Cst and the capacitor Cst is charged with a data voltage Vdata.

The second driver 34 may include a fifth switch element M5 and a sixth switch element M6. The second driver 34 applies an initialization voltage Vini to the first driver 32 and an anode electrode of the OLED EL to initialize the capacitor Cst and an anode voltage of the OLED EL.

The pixel circuit may further include a third driver 36. The third driver 36 may include one or more switch elements M3 and M4. The switch elements M3 and M4 of the third driver 36 switch a current path between a pixel driving voltage ELVDD and the OLED EL in response to an EM pulse.

Each of the driving element DT and the switch elements M1 to M6 of the pixel circuit may be embodied as a p-channel transistor but is not limited thereto. The switch elements M1 to M6 are turned on by the gate-on voltage VGL/VEL applied to gate electrodes thereof and are turned off by the gate-off voltage VGH/VEH.

The pixel circuit is connected to a data line DL to which a data voltage Vdata of pixel data is applied, gate lines GL1, GL2, and GL3 to which gate signals SCAN(N-1), SCAN(N), and EM(N) are supplied, and power lines PL1, PL2, and PL3 to which static voltages ELVDD, ELVSS, and Vini are applied. The first and second gate lines GL1 and GL2 are scan lines to which scan pulses are supplied, and the third gate line GL3 is an EM line to which an EM pulse is supplied.

As shown in FIG. 5, the pixel circuit may be driven by dividing a driving period into an initialization period Tini, a sampling period Tsam, and a light emission period Tem. In FIG. 5, DTG denotes a gate voltage of the driving element DT, i.e., a voltage of a second node n2.

The $N^{th}$ scan pulse SCAN(N) is generated to have the gate-on voltage VGL in the sampling period Tsam and is applied to the first gate line GL1. The $N^{th}$ scan pulse SCAN(N) is synchronized with the data voltage Vdata applied to pixels of an $N^{th}$ pixel line. The $(N-1)^{th}$ scan pulse SCAN(N-1) is generated to have the gate-on voltage VGL in the initialization period Tini before the sampling period Tsam and is applied to the second gate line GL2. The $(N-1)^{th}$ scan pulse SCAN(N-1) is synchronized with the data voltage Vdata applied to pixels of an $(N-1)^{th}$ pixel line. The EM pulse EM(N) is generated to have the gate-off voltage VEH in the initialization period Tini and the sampling period Tsam and is applied to the third gate line GL3. The voltage of the EM pulse EM(N) is inverted to the gate-on voltage VEL in the light emission period Tem. The EM pulse EM(N) may be applied simultaneously to the pixels of the $(N-1)^{th}$ and $N^{th}$ pixel lines.

During the initialization period Tini, the $(N-1)^{th}$ scan pulse SCAN(N-1) of the gate-on voltage VGL is supplied to the second gate line GL2 and the EM pulse EM(N) of the gate-off voltage VGH is supplied to the third gate line GL3. In this case, a voltage of the first gate line GL1 is the gate-off voltage VGH. In the initialization period Tini, the fifth switch element M5 is turned on according to the gate-on voltage VGL of the $(N-1)^{th}$ scan pulse SCAN(N-1). In the initialization period Tini, the initialization voltage Vini is applied to the second node n2, thereby initializing the capacitor Cst.

In the sampling period Tsam, the $N^{th}$ scan pulse SCAN(N) of the gate-on voltage VGL is applied to the first gate line GL1. In this case, voltages of the second gate line GL2 and the third gate line GL3 are the gate-off voltages VGH and VEH. In the sampling period Tsam, the first and second switch elements M1 and M2 are turned on according to the gate-on voltage VGL of the $N^{th}$ scan pulse SCAN(N) and thus the driving element DT is turned on to sample a threshold voltage Vth of the driving element DT. The data voltage Vdata compensated for by the sampled threshold voltage Vth of the driving element DT is stored in the capacitor Cst. In the sampling period Tsam, the sixth switch element M6 is turned on and thus a voltage of a fourth node n4 is initialized to an initialization voltage Vini, thereby suppressing light emission of the OLED EL.

When the light emission period Tem begins, a voltage of the EM pulse EM(N) supplied to the third gate line GL3 is inverted to the gate-on voltage VEL. In the light emission period Tem, both the first and second gate lines GL1 and GL2 are maintained at the gate-off voltage VGH. In the light emission period Tem, the third and fourth switch elements M3 and M4 are turned on to form a current path between the pixel driving voltage ELVDD and the low-potential power supply voltage VSS, thereby causing the OLED EL to emit light. In the light emission period Tem, in order to precisely express low-gradation luminance, a voltage of the EM pulse EM(N) may be inverted at a certain duty ratio between the gate-on voltage VEL and the gate-off voltage VEH. In this case, the third and fourth switch elements M3 and M4 may be repeatedly turned on or off according to the duty ratio of the EM pulse EM(N) during the light emission period Tem.

The OLED EL may include an anode electrode, a cathode electrode, and an organic compound layer connected between the anode electrode and the cathode electrode as described above. The organic compound layer may include, but is not limited to, an HIL, an HTL, an EML, an ETL, and an EIL. The anode electrode of the OLED EL is connected to the fourth node n4. The cathode electrode of the OLED EL is connected to a second power line PL2 to which the low-potential power voltage ELVSS is applied.

The driving element DT includes a gate electrode connected to the second node n2, a first electrode connected to the first node n1, and a second electrode connected to the third node n3, and generates current to drive the OLED EL according to a gate-source voltage Vgs.

The capacitor Cst is connected between the first power line PL1 to which the pixel driving voltage ELVDD is applied and the second node n2.

In the sampling period Tsam, the first switch element M1 connects the second node n2 to the third node n3 in response to the $N^{th}$ scan pulse SCAN(N). A gate electrode of the first switch element M1 is connected to the first gate line GL1 to which the $N^{th}$ scan pulse SCAN(N) is applied. A first electrode of the first switch element T1 is connected to the second node n2 and a second electrode of the first switch element T1 is connected to the third node n3.

The first switch element M1 is turned on in a very short horizontal period 1H of a one-frame period in which the $N^{th}$ scan pulse SCAN(N) is generated to have the gate-on voltage VGL and thus leakage current may occur in the first switch element M1 that is in an off state. To suppress leakage current in the first switch element M1, the first switch element M1 may be embodied as a transistor having a dual gate structure in which two transistors are connected in series.

In the sampling period Tsam, the second switch element M2 applies a data voltage Vdata of pixel data to the first node n1 in response to the $N^{th}$ scan pulse SCAN(N). A gate electrode of the second switch element M2 is connected to the first gate line GL1. A first electrode of the second switch element M2 is connected to the first node n1. A second electrode of the second switch element M2 is connected to the data line DL to which the data voltage Vdata is applied.

In the light emission period Tem, the third switch element M3 is turned on to apply the pixel driving voltage ELVDD to the first node n1, in response to the gate-on voltage VEL of the third gate line GL3 to which the EM pulse EM (N) is supplied. A gate electrode of the third switch element M3 is connected to the third gate line GL3. A first electrode of the third switch element M3 is connected to the first power line PL1 in which the pixel driving voltage ELVDD is applied and a second electrode thereof is connected to the first node n1.

In the light emission period Tem, the third switch element M3 is turned on to connect the third node n3 to the fourth node n4, in response to the gate-on voltage VEL of the third gate line GL3 to which the EM pulse EM (N) is supplied. A gate electrode of the fourth switch element M4 is connected to the third gate line GL3. A first electrode of the fourth switch element T4 is connected to the third node n3 and a second electrode thereof is connected to the fourth node n4.

In the initialization period Tini, the fifth switch element M5 applies the initialization voltage Vini to the second node n2 in response to the $(N-1)^{th}$ scan pulse SCAN(N-1). A gate electrode of the fifth switch element M5 is connected to the second gate line GL2 to which the $(N-1)^{th}$ scan pulse SCAN(N-1) is applied. A first electrode of the fifth switch element M5 is connected to the second node n2 and a second electrode thereof is connected to the third power line PL3 to which the initialization voltage Vini is applied. To suppress leakage current in the fifth switch element M5, the fifth switch element M5 may be embodied as a transistor having a dual gate structure in which two transistors are connected in series.

In the sampling period Tsam, the sixth switch element M6 applies the initialization voltage Vini to the fourth node n4 in response to the $N^{th}$ scan pulse SCAN(N). A gate electrode of the sixth switch element M6 is connected to the first gate line GL1 to which the $N^{th}$ scan pulse SCAN(N) is applied. A first electrode of the sixth switch element M6 is connected to the third power line PL3 and a second electrode thereof is connected to the fourth node n4.

A gate-off voltage of the $N^{th}$ scan pulse SCAN(N) for controlling the first and second switch elements M1 and M2 of the first driver 32 and a gate-off voltage to be applied to the fifth and sixth switch elements M5 and M6 of the second driver 34 may be set to be different from each other. For example, as described in the following embodiment, the gate-off voltage VGH to be applied to the first driver 32 may be set to a first gate-off voltage VGH1 and the gate-off voltage VGH to be applied to the second driver 34 may be set to a second gate-off voltage VGH2, and vice versa. A gate-off voltage of the EM pulse EM(N) for controlling the third driver 36 may be the first gate-off voltage VGH1 or the second gate-off voltage VGH2.

The gate-off voltage VGH for controlling the off states of the switch elements M1 and M2 of the first driver 32 is set to a voltage to be turned on in a dynamic range of the data voltage Vdata corresponding to a gradation value of the pixel data. The gate-off voltage VGH for controlling the off states of the switch elements M5 and M6 of the second driver 34 is set to prevent leakage current from occurring in the light emission period Tem. When the gate-off voltage VGH is set to be optimized for the first driver 32 or the second driver 34, the second switch element T2 may malfunction at a data voltage of some gradation levels and thus may be turned off in the sampling period Tsam or leakage current may increase in the second driver 34 and thus a voltage of the capacitor Cst may be discharged, thus resulting in a decrease of luminance of pixels and holding characteristics.

An optimal level of the gate-off voltage VGH to be applied to the first and second drivers 32 and 34 may vary according to an aging method of a display device. For example, when the gate-off voltage VGH to be applied to the first driver 32 is set to be higher than the gate-off voltage VGH to be applied to the second gate driver 34, driving characteristics of the first and second drivers 32 and 34 may be optimized. On the other hand, when the gate-off voltage VGH to be applied to the first driver 32 is set to be lower than the gate-off voltage VGH to be applied to the second gate driver 34, driving characteristics of the first and second drivers 32 and 34 may be optimized. To this end, a gate driving circuit according to an embodiment of the present disclosure outputs different gate-off voltages VGH to be applied to the first driver 32 and the second driver 34. Because luminance of each subpixel changes according to leakage current in transistors, optimal levels of the gate-off voltage VGH to be applied to the first driver 32 and the gate-off voltage VGH to be applied to the second driver 34 may be determined on the basis of a result of measuring the luminance of each subpixel after an aging process.

Figure 6:
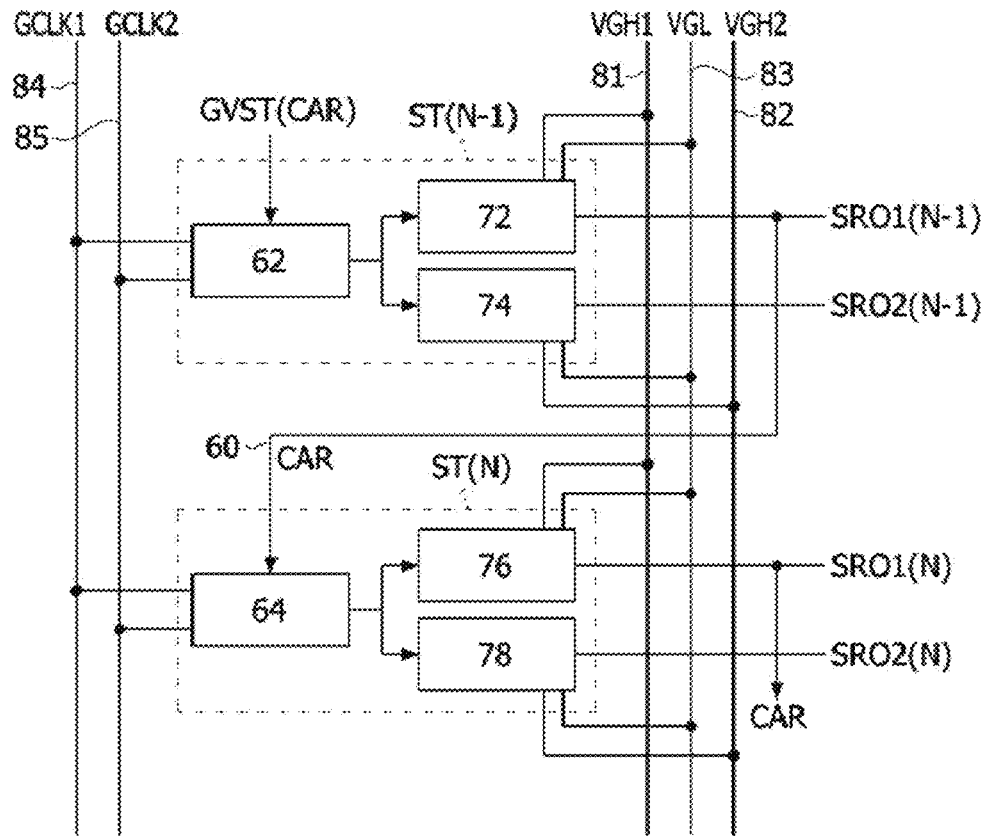
FIG. 6 illustrates a gate driving circuit according to an embodiment of the present disclosure.

FIG. 6 illustrates a gate driving circuit according to an embodiment of the present disclosure.

Referring to FIG. 6, the gate driving circuit includes a shift register of a first gate driver 121 for outputting scan pulses sequentially.

The shift register includes signal transmitters ST(N-1) to ST (N) connected in a dependent manner through a carry signal line 60. The shift register receives a start pulse GVST and shift clocks GCLK1 and GCLK2, and sequentially outputs and shifts scan pulses SRO1(N-1) to SRO2(N) according to the shift clocks GCLK1 and GCLK2. The shift clocks GCLK1 and GCLK2 are input to the signal transmitters ST(i−1) to ST(i+2) through the carry signal line 60. In an example of FIG. 6, the shift clocks GCLK1 and GCLK2 may be 2-phase clocks that are shifted sequentially but are not limited thereto. For example, the shift clocks GCLK1 and GCLK2 may be n-phase clocks (n is a natural number greater than or equal to 2).

Each of the signal transmitters ST(N-1) to ST(N) includes controllers 62 and 64, first outputters 72 and 76, and second outputters 74 and 78.

The controllers 62 and 64 include a start signal input node to which the start pulse GVST or a carry signal CAR from a preceding signal transmitter is input, and a clock input node connected to clock lines 84 and 85 to which the shift clocks GCLK1 and GCLK2 are input. As shown in FIG. 7, the controllers 62 and 64 may further include a VGL node to which a gate-on voltage VGL is applied and a first VGH node to which a first gate-off voltage VGH1 is applied. The controllers 62 and 64 charge or discharge first and second control nodes to control rising and falling timings of each of first and second scan pulses SRO1(N-1), SRO1(N), SRO2(N-1), and SRO2(N) output from the first outputters 72 and 76 and the second outputters 74 and 78.

Figure 7A:
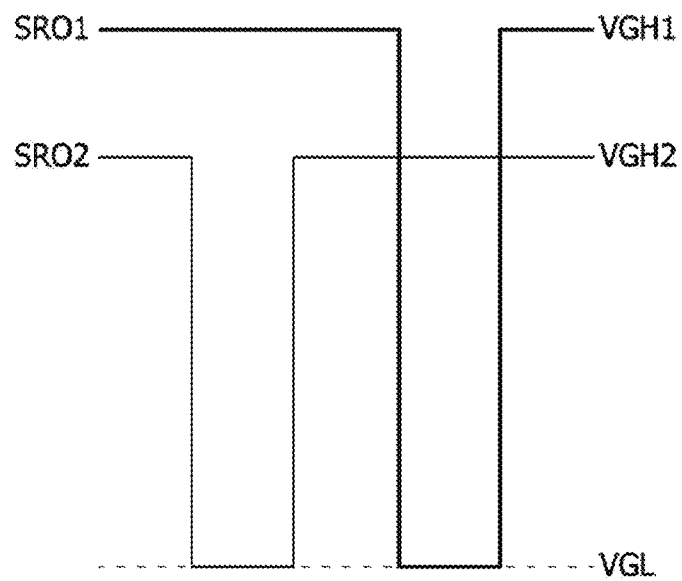
FIGS. 7A and 7B are diagrams illustrating gate-off voltages of scan pulses having different voltages.
Figure 7B:
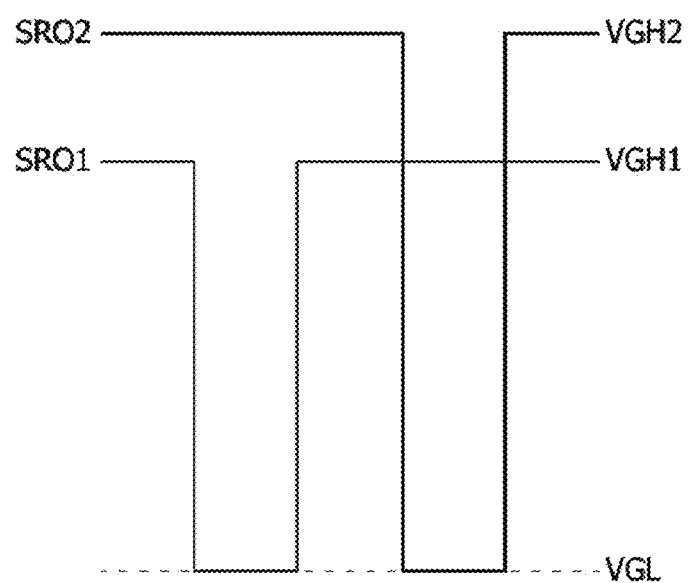

As shown in FIGS. 7A and 7B, the first and second scan pulses SRO1(N-1) and SRO2(N-1) output from the $(N-1)^{th}$ signal transmitter ST(N-1) may have the same gate-on voltage VGL and different gate-off voltages VGH1 and VGH2. The first scan pulse SRO1(N-1) and the second scan pulse SRO2(N-1) may be generated as same-phase pulses and thus rising and falling timings thereof may be the same.

The $(N-1)^{th}$ signal transmitter ST(N-1) outputs a carry signal CAR and simultaneously outputs the first and second scan pulses SRO1(N-1) and SRO2(N-1). The carry signal CAR may be input to a start signal input node of a next signal transmitter ST(N) through the carry signal line 60 connected to either a first output node through which the first scan pulse SRO1(N-1) is output or a second output node through which the second scan pulse SRO2(N-1) is output.

The $N^{th}$ signal transmitter ST(N) outputs the first and second scan pulses SRO1(N) and SRO2(N) subsequent to the scan pulses SRO1(N-1) and SRO2(N-1) output from the $(N-1)^{th}$ signal transmitter ST(N-1), in response to the carry signal from the $(N-1)^{th}$ signal transmitter ST(N-1). As shown in FIGS. 7A and 7B, the first and second scan pulses SRO1(N) and SRO2(N) output from the $N^{th}$ signal transmitter ST(N) may have the same gate-on voltage VGL and different gate-off voltages VGH1 and VGH2. The first scan pulse SRO1(N) and the second scan pulse SRO2(N) may be generated as same-phase pulses and thus rising and falling timings thereof may be the same. The $N^{th}$ signal transmitter ST(N) outputs the carry signal CAR and simultaneously outputs the first and second scan pulses SRO1(N) and SRO2(N). The carry signal CAR may be input to a start signal input node of a next signal transmitter (not shown) through the carry signal line 60 connected to either the first output node through which the first scan pulse SRO1(N) is output or the second output node through which the second scan pulse SRO2(N) is output.

The first scan pulses SRO1(N-1) and SRO1(N) may be applied to the first driver 32 or the second driver 34. When the first scan pulses SRO1(N-1) and SRO1(N) are applied to the first driver 32 of the pixel circuit, the second scan pulses SRO2(N-1) and SRO2(N) may be applied to the second driver 34 of the pixel circuit. On the other hand, when the first scan pulses SRO1(N-1) and SRO1(N) are applied to the second driver 34 of the pixel circuit, the second scan pulses SRO2(N-1) and SRO2(N) may be applied to the first driver 32 of the pixel circuit.

The first outputters 72 and 76 output the first scan pulses SRO1(N-1) and SRO1(N) under control of the controllers 62 and 64. As shown in FIGS. 7A and 7B, the first outputters 72 and 76 are connected to a VGH1 line 81 to which the first gate-off voltage VGH1 is applied and a VGL line 83 to which the gate-on voltage VGL is applied, and output the first scan pulses SRO1(N-1) and SRO1(N) that swing between the gate-on voltage VGL and the first gate-off voltage VGH1.

The second outputters 74 and 78 output the second scan pulses SRO2(N-1) and SRO2(N) under control of the controllers 62 and 64. The second outputters 74 and 78 are connected to a VGH2 line 82 to which the second gate-off voltage VGH2 is applied and a VGL line 83 to which the gate-on voltage VGL is applied, and outputs the second scan pulses SRO2(N-1) and SRO2(N) that swing between the gate-on voltage VGL and the second gate-off voltage VGH2.

In the case of the pixel circuit of FIG. 4, the gate-off voltage VGH of the $N^{th}$ scan pulse applied to the first driver 32 may be the first gate-off voltage VGH1 and the gate-off voltage VGH of the $(N-1)^{th}$ scan pulse applied to the second driver 34 may be the second gate-off voltage VGH2, and vice versa.

The first scan pulse SRO1(N-1) output from the $(N-1)^{th}$ signal transmitter ST(N-1) and the first scan pulse SRO1(N) output from the $N^{th}$ signal transmitter ST(N) may be applied to gate electrodes of the switch elements M5 and M6 of the second driver 34. In this case, the second scan pulse SRO2(N) output from the $N^{th}$ signal transmitter ST(N) may be applied to gate electrodes of the switch elements M1 and M2 of the first driver 32. In this case, the $N^{th}$ scan pulse applied to the first driver 32 may be the first scan pulse SRO1(N) output from the $N^{th}$ signal transmitter ST(N), the $(N-1)^{th}$ scan pulse applied to the second driver 34 may be the second scan pulse SRO2(N-1) output from the $(N-1)^{th}$ signal transmitter ST(N-1), and the $N^{th}$ scan pulse applied to the second driver 34 may be the second scan pulse SRO2(N) output from the $N^{th}$ signal transmitter ST(N).

On the other hand, the second scan pulse SRO2(N-1) output from the $(N-1)^{th}$ signal transmitter ST(N-1) and the second scan pulse SRO2(N) output from the $N^{th}$ signal transmitter ST(N) may be applied to the gate electrodes of the switch elements M5 and M6 of the second driver 34. In this case, the first scan pulse SRO1(N) output from the $N^{th}$ signal transmitter ST(N) may be applied to the gate electrodes of the switch elements M1 and M2 of the first driver 32. In this case, the $N^{th}$ scan pulse applied to the first driver 32 may be the second scan pulse SRO2(N) output from the $N^{th}$ signal transmitter ST(N), the $(N-1)^{th}$ scan pulse applied to the second driver 34 may be the first scan pulse SRO1(N-1) output from the $(N-1)^{th}$ signal transmitter ST(N-1), and the $N^{th}$ scan pulse applied to the second driver 34 may be the first scan pulse SRO1(N) output from the $N^{th}$ signal transmitter ST(N).

As shown in FIGS. 7A and 7B, the first gate-off voltage VGH1 may be set to be higher or lower than the second gate-off voltage VGH2. In FIGS. 7A and 7B, "SRO1" denotes the first scan pulses SRO1(N-1) and SRO1(N) shown in FIG. 6, and "SRO2" denotes the second scan pulses SRO2(N-1) and SRO2(N) shown in FIG. 6.

Figure 8:
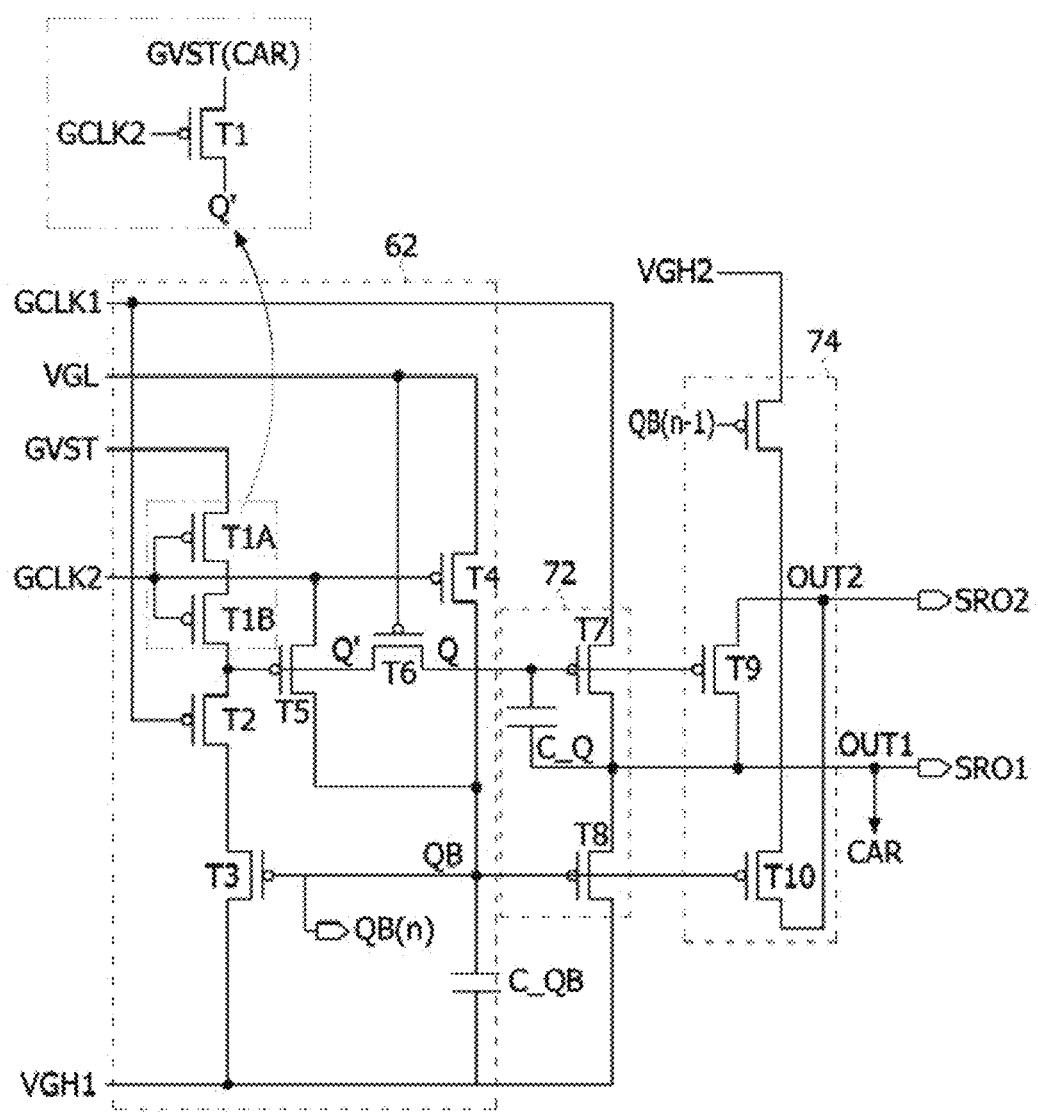
FIG. 8 is a circuit diagram of an example of an $(N-1)^{th}$ signal transmitter as shown in FIG. 6.
Figure 9:
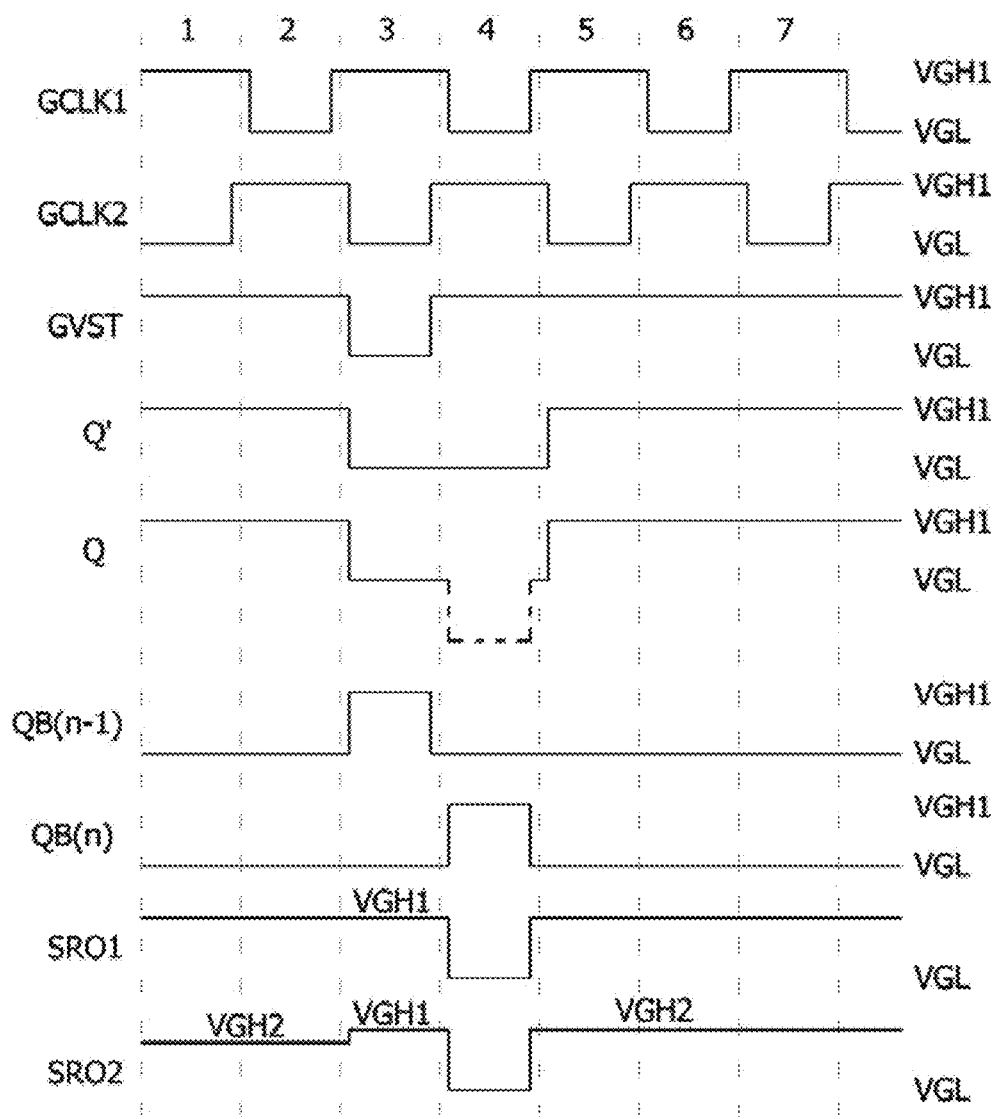
FIG. 9 is a waveform diagram of input and output signals of the signal transmitter and a control node voltage as shown in FIG. 6.

FIG. 8 is a circuit diagram of an example of the $(N-1)^{th}$ signal transmitter of FIG. 6. The other signal transmitters that are not shown in FIG. 8 may be embodied as circuits that are substantially same as that of FIG. 8. FIG. 9 is a waveform diagram of input and output signals of the signal transmitter of FIG. 6 and a control node voltage. It should be understood that a circuit of a signal transmitter is not limited to that shown in FIG. 8. For example, in FIG. 8, some transistors may be omitted or transistors may be added to a circuit of a controller 62.

Referring to FIGS. 8 and 9, the controller 62 includes a plurality of transistors T1A to T6. The controller 62 further includes clock input nodes to which a first shift clock GCLK1 and a second shift clock GCLK2 are input, a start signal input node to which a start pulse GVST or a carry signal from a preceding signal transmitter is input, a VGL node to which a gate-on voltage VGL is applied, and a VGH1 node to which a first gate-off voltage VGH1 is applied. A first clock input node is connected to a first clock line 84. A second clock input node is connected to a second clock line 85. The start signal input node is connected to a line or a carry signal line 60 to which a start pulse GVST is applied. The VGL node is connected to a VGL line 83.

The first transistor T1 may be embodied as one transistor or transistors T1A and T1B having a dual gate structure in which two transistors are connected in series. The first transistor T1 is turned on according to the gate-on voltage VGL of the second shift clock GCLK2. When the first transistor T1 is turned on, a voltage of the start pulse GVST or a carry signal CAR is transmitted to a 1-1 control node Q' and a voltage of the 1-1 control node Q' is changed to the gate-on voltage VGL. The first transistor T1 includes a gate electrode connected to the second clock input node to which the second shift clock GCLK2 is applied, a first electrode to which the start pulse GVST or the carry signal CAR is applied, and a second electrode connected to a 1-1 control node Q'.

The second transistor T2 is turned on according to the gate-on voltage VGL of the first shift clock GCLK1 to connect the 1-1 control node Q' to a first electrode of the third transistor T3. The second transistor T2 includes a gate electrode connected to the first clock input node to which the first shift clock GCLK1 is applied, a first electrode connected to the 1-1 control node Q', and a second electrode connected to the first electrode of the third transistor T3. The third transistor T3 is turned on according to the gate-on voltage VGL of the second control node QB to connect the second electrode of the second transistor T2 to the VGH1 node. The third transistor T3 includes a gate electrode connected to the second control node QB, a first electrode connected to the second electrode of the second transistor T2, and a second electrode connected to the VGH1 node. When both the second and third transistors T2 and T3 are turned on, a voltage of the 1-1 control node Q' is the first gate-off voltage VGH1. The second control node QB may be connected to a gate electrode of the eleventh transistor T11 of a next signal transmitter ST(N).

The fourth transistor T4 is turned on according to the gate-on voltage VGL of the second shift clock GCLK2 to connect the VGL node to the second control node QB. When the fourth transistor T4 is turned on, a voltage of the second control node QB changes to the gate-on voltage VGL. The fourth transistor T4 includes a gate electrode connected to the second clock input node to which the second shift clock GCLK2 is applied, a first electrode connected to the VGL node, and a second electrode connected to the second control node QB.

When the voltage of the 1-1 control node Q' is the gate-on voltage VGL, the fifth transistor T5 is turned on to connect the second clock node to the second control node QB. The fifth transistor T5 includes a gate electrode connected to the 1-1 control node Q', a first electrode connected to the second clock input node, and a second electrode connected to the second control node QB.

The sixth transistor T6 is turned on according to the gate-on voltage VGL to connect the 1-1 control node Q' to a 1-2 control node Q. When the sixth transistor T6 is turned on, the 1-2 control node Q may be charged with the gate-on voltage VGL. The sixth transistor T6 includes a gate electrode connected to the VGL node, a first electrode connected to the 1-1 control node Q', and a second electrode connected to the 1-2 control node Q.

The signal transmitter may further include a first capacitor C_Q connected between the 1-2 control node Q and a first output node OUT1 and a second capacitor C_QB connected between the second control node QB and the VGH1 node. When the first output node OUT1 is charged with the gate-on voltage VGL, bootstrapping may occur through the first capacitor C_Q and thus a voltage of the 1-2 control node Q may be boosted, for example, at a fourth point in time 4 as shown in FIG. 9. The second capacitor C_QB suppresses ripples of a voltage of the second control node QB.

The first outputter 72 outputs the first scan pulse SRO1 that swings between the gate-on voltage VGL and the first gate-off voltage VGH1 in response to the voltages of the 1-2 control node Q and the second control node QB. The first outputter 72 includes seventh and eighth transistors T7 and T8.

The seventh transistor T7 is a pull-up transistor that raises the first scan pulse SRO1. The seventh transistor T7 includes a gate electrode connected to the 1-2 control node Q, a first electrode connected to the first clock input node, and a second electrode connected to the first output node OUT1.

The eighth transistor T8 is a pull-down transistor that drops the first scan pulse SRO1. The eighth transistor T8 includes a gate electrode connected to the second control node QB, a first electrode connected to the first output node OUT1, and a second electrode connected to the VGH1 node.

The second outputter 74 outputs the second scan pulse SRO2 that swings between the gate-on voltage VGL and the second gate-off voltage VGH2 in response to the voltages of the 1-2 control node Q and the second control node QB. The second outputter 74 includes ninth to eleventh transistors T9, T10, and T11.

The ninth transistor T9 is a pull-up transistor that raises the second scan pulse SRO2. The ninth transistor T9 includes a gate electrode connected to the 1-2 control node Q, a first electrode connected to a second output node OUT2, and a second electrode connected to the first output node OUT1.

The tenth transistor T10 is a pull-down transistor that drops the second scan pulse SRO2. The tenth transistor T10 includes a gate electrode connected to the second control node QB, a first electrode connected to a second electrode to which the second gate-off voltage VGH2 is applied through the eleventh transistor T11, and a second electrode connected to the second output node OUT2.

In FIG. 9, when the 1-1 control node Q' and the 1-2 control node Q are simultaneously charged with the gate-on voltage VGL, for example, at a third point in time 3, the eighth to tenth transistors T8 to T10 may be simultaneously turned on, thus causing short circuit of the VGH1 node and the VGH2 node. The eleventh transistor T11 is turned off according to a voltage of a second control node QB(n-1) from a preceding signal transmitter when the 1-1 control node Q' and the 1-2 control node Q are simultaneously charged with the gate-on voltage VGL, thereby blocking the second gate-off voltage VGH2. The eleventh transistor T11 includes a gate electrode connected to the second control node QB(n-1) of the preceding signal transmitter, a first electrode connected to the VGH2 node, and a second electrode connected to the first electrode of the tenth transistor 10. The eleventh transistor T11 may be omitted. In this case, the second gate-off voltage VGH2 is applied to the first electrode of the tenth transistor 10.

In FIG. 9, the first scan pulse SRO1 and the second scan pulse SRO2 may be switched with each other. In other words, the first outputter 72 may output the second scan pulse SRO2 and the second outputter 74 may output the first scan pulse SRO1.

According to the present disclosure, a gate-off voltage of a scan pulse for controlling switch elements of a pixel circuit may be divided to voltages optimized for driving characteristics of the switch elements, thereby achieving a voltage optimized for leakage current occurring in the pixel circuit and improving holding characteristics.

Effects of the present disclosure are not limited thereto and other effects that are not described here will be clearly understood by those of ordinary skill in the art from the following claims.

The objects to be achieved by the present disclosure, the means for achieving the objects, and effects of the present disclosure described above do not specify essential features of the claims, and thus, the scope of the claims is not limited to the disclosure of the present disclosure.

It will be apparent to those skilled in the art that various modifications and variations can be made in the gate driving circuit and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driving circuit, comprising:
   an $(N-1)^{th}$ signal transmitter to which a start pulse or carry signal, a shift clock, a gate-on voltage, a first gate-off voltage, and a second gate-off voltage are applied, wherein N is a natural number; and
   an $N^{th}$ signal transmitter to which a carry signal from the $(N-1)^{th}$ signal transmitter, the shift clock, the gate-on voltage, the first gate-off voltage, and the second gate-off voltage are applied,
   wherein each of the $(N-1)^{th}$ and $N^{th}$ signal transmitters comprises:
      a first outputter configured to output a first scan pulse that swings between the gate-on voltage and the first gate-off voltage;
      a second outputter configured to output a second scan pulse that swings between the same gate-on voltage with a same polarity as the gate-on voltage of the first scan pulse and the second gate-off voltage different from the first gate-off voltage; and
      a controller configured to control the first and second outputters, the controller including a VGH1 node to which the first gate-off voltage is directly applied, and
   wherein the first gate-off voltage is set to be higher or lower than the second gate-off voltage.

2. The gate driving circuit of claim 1, wherein the first and second scan pulses output from the $(N-1)^{th}$ signal transmitter are generated to have the same phase with at least one of a same rising time and a same falling time.

3. The gate driving circuit of claim 1, wherein the $N^{th}$ signal transmitter outputs the first and second scan pulses subsequent to the first and second scan pulses output from the $(N-1)^{th}$ signal transmitter, in response to the carry signal from the $(N-1)^{th}$ signal transmitter, and
   wherein the first and second scan pulses output from the $N^{th}$ signal transmitter are generated to have the same phase with at least one of a same rising time and a same falling time.

4. The gate driving circuit of claim 1, wherein the controller comprises:
   a first transistor including a gate electrode connected to a second clock input node to which a second shift clock is applied, a first electrode to which the start pulse or the carry signal is applied, and a second electrode connected to a 1-1 control node;
   a second transistor including a gate electrode connected to a first clock input node to which the first shift clock is applied, a first electrode connected to the 1-1 control node, and a second electrode;
   a third transistor including a gate electrode connected to a second control node, a first electrode connected to the second electrode of the second transistor, and a second electrode connected to the VGH1 node;
   a fourth transistor including a gate electrode connected to the second clock input node, a first electrode connected to a VGL node to which the gate-on voltage is applied, and a second electrode connected to the second control node;
   a fifth transistor including a gate electrode connected to the 1-1 control node, a first electrode connected to the second clock input node, and a second electrode connected to the second control node; and
   a sixth transistor including a gate electrode connected to the VGL node, a first electrode connected to the 1-1 control node, and a second electrode connected to a 1-2 control node.

5. The gate driving circuit of claim 4, wherein the first outputter comprises:
   a seventh transistor including a gate electrode connected to the 1-2 control node, a first electrode connected to the first clock input node, and a second electrode connected to a first output node through which the first scan pulse is output; and
   an eighth transistor including a gate electrode connected to the second control node, a first electrode connected to the first output node, and a second electrode connected to the VGH1 node.

6. The gate driving circuit of claim 4, wherein the second outputter comprises:
   a ninth transistor including a gate electrode connected to the 1-2 control node, a first electrode connected to a second output node through which the second scan pulse is output, and a second electrode connected to the first output node; and
   a tenth transistor including a gate electrode connected to the second control node, a first electrode to which the second gate-off voltage is applied, and a second electrode connected to the second output node.

7. The gate driving circuit of claim 4, wherein the second outputter comprises:
   a ninth transistor including a gate electrode connected to the 1-2 control node, a first electrode connected to a second output node through which the second scan pulse is output, and a second electrode connected to the first output node;
   a tenth transistor including a gate electrode connected to the second control node, a first electrode to which the second-off voltage is applied, and a second electrode connected to the second output node; and an eleventh transistor including a gate electrode connected to a second control node of a preceding signal transmitter, a first electrode connected to a VGH2 node to which the second gate-off voltage is applied, and a second electrode connected to the first electrode of the tenth transistor.

8. The gate driving circuit of claim 1, wherein:
the gate-on voltage of the first and second scan pulses is lower than both the first gate-off voltage and the second gate-off voltage or is higher than both the first gate-off voltage and the second gate-off voltage; and
the first and second scan pulses are both configured to be supplied to p-type transistors or both configured to be supplied to n-type transistors.

9. The gate driving circuit of claim 1, wherein the controller further includes a transistor with an electrode connected directly to the VGH1 node.

10. A display device, comprising:
a pixel array including a plurality of data lines, a plurality of gate lines, a plurality of power lines to which a constant voltage is applied, and a plurality of subpixels;
a data driver configured to apply a data voltage to the plurality of data lines; and
a gate driver configured to sequentially supply scan pulses to scan lines among the plurality of gate lines using a first shift register,
wherein the first shift register comprises:
an (N-1)$^{th}$ signal transmitter to which a start pulse or carry signal, a shift clock, a gate-on voltage, a first gate-off voltage, and a second gate-off voltage are applied, wherein N is a natural number; and
an N$^{th}$ signal transmitter to which a carry signal from the (N-1)$^{th}$ signal transmitter, the shift clock, the gate-on voltage, the first gate-off voltage, and the second gate-off voltage are applied,
wherein each of the (N-1)$^{th}$ and N$^{th}$ signal transmitters comprises:
a first outputter configured to output a first scan pulse that swings between the gate-on voltage and the first gate-off voltage;
a second outputter configured to output a second scan pulse that swings between the same gate-on voltage with a same polarity as the gate-on voltage of the first scan pulse and the second gate-off voltage different from the first gate-off voltage; and
a controller configured to control the first and second outputters, the controller including a VGH1 node to which the first gate-off voltage is directly applied, and
wherein the first gate-off voltage is set to be higher or lower than the second gate-off voltage.

11. The display device of claim 10, wherein the first and second scan pulses output from the (N-1)$^{th}$ signal transmitter are generated to have the same phase with at least one of a same rising time and a same falling time.

12. The display device of claim 10, wherein the N$^{th}$ signal transmitter outputs the first and second scan pulses subsequent to the first and second scan pulses output from the (N-1)$^{th}$ signal transmitter, in response to the carry signal from the (N-1)$^{th}$ signal transmitter, and
wherein the first and second scan pulses output from the N$^{th}$ signal transmitter are generated to have the same phase with at least one of a same rising time and a same falling time.

13. The display device of claim 10, wherein a pixel circuit of each of the subpixels comprises:
a driving element configured to drive a light emitting element;
a first driver including a capacitor connected to a gate electrode of the driving element and one or more switch elements; and
a second driver configured to initialize the capacitor and an anode voltage of the light emitting element, the second driver including one or more switch elements, and
wherein the gate-off voltage of the scan pulse applied to the first driver and the gate-off voltage of the scan pulse applied to the second driver are different from each other.

14. The display device of claim 12, wherein:
the first scan pulse output from the (N-1)$^{th}$ signal transmitter and the first scan pulse output from the N$^{th}$ signal transmitter are applied to a gate electrode of a switch element of the second driver, and the second scan pulse output from the N$^{th}$ signal transmitter is applied to a gate electrode of a switch element of the first driver, or
the second scan pulse output from the (N-1)$^{th}$ signal transmitter and the second scan pulse output from the N$^{th}$ signal transmitter are applied to the gate electrode of the switch element of the second driver, and the first scan pulse output from the N$^{th}$ signal transmitter is applied to the gate electrode of the switch element of the first driver.

15. The display device of claim 10, wherein the gate driver sequentially supplies light emission control pulses to light emission lines among the plurality of gate lines using a second shift register.

16. The display device of claim 15, wherein a pixel circuit of each of the subpixels comprises:
a driving element configured to drive an organic light-emitting diode (OLED);
a first driver to which a pixel driving voltage and the data voltage are applied;
a second driver to which an initialization voltage is applied; and
a third driver configured to switch a current path between the pixel driving voltage and the light emitting element.

17. The display device of claim 16, wherein the pixel circuit of each of the subpixels receives the pixel driving voltage, the data voltage, the initialization voltage, an (N-1)$^{th}$ scan pulse, an N$^{th}$ scan pulse, and the light emission control pulse, and is driven by dividing a driving period into an initialization period, a sampling period, and a light emission period.

18. The display device of claim 17, wherein:
the first driver comprises a capacitor, a first switch element, and a second switch element, and is configured to sample a threshold voltage of the driving element, store the sampled threshold voltage, and charge the capacitor with the data voltage,
the third driver comprises a third switch element and a fourth switch element each configured to switch a current path between the pixel driving voltage and the light emitting element in response to the light emission control pulse, and
the second driver is configured to apply the initialization voltage to the first driver and an anode electrode of the light emitting element to initialize the capacitor and an anode voltage of the light emitting element, the second driver including a fifth switch element and a sixth switch element.

19. The display device of claim 18, wherein:
the driving element comprises a gate electrode connected to a second node, a first electrode connected to a first node, and a second electrode connected to a third node,
the light emitting element comprises an anode electrode connected to a fourth node and a cathode electrode to which a low-potential power supply voltage is applied,
in the sampling period, the first switch element connects the second node to the third node in response to the $N^{th}$ scan pulse,
in the sampling period, the second switch element applies the data voltage to the first node in response to the $N^{th}$ scan pulse,
in the light emission period, the third switch element is turned on to apply the pixel driving voltage to the first node according to the gate-on voltage of the light emission control pulse,
in the light emission period, the fourth switch element is turned on to connect the third node to the fourth node according to the gate-on voltage of the light emission control pulse,
in the initialization period, the fifth switch element applies the initialization voltage to the second node in response to the $(N-1)^{th}$ scan pulse, and
in the sampling period, the sixth switch element applies the initialization voltage to the fourth node in response to the $N^{th}$ scan pulse.

20. The display device of claim 19, wherein:
a gate-off voltage of the $N^{th}$ scan pulse applied to the first driver is the first gate-off voltage, and gate-off voltages of the $(N-1)^{th}$ and $N^{th}$ scan pulses applied to the second driver are the second gate-off voltage, or the gate-off voltage of the $N^{th}$ scan pulse applied to the first driver is the second gate-off voltage, and the gate-off voltages of the $(N-1)^{th}$ and $N^{th}$ scan pulses applied to the second driver are the first gate-off voltage.

21. The display device of claim 19, wherein:
the $N^{th}$ scan pulse applied to the first driver is a first scan pulse output from the $N^{th}$ signal transmitter, the $(N-1)^{th}$ scan pulse applied to the second driver is a second scan pulse output from the $(N-1)^{th}$ signal transmitter, and the $N^{th}$ scan pulse applied to the second driver is a second scan pulse output from the $N^{th}$ signal transmitter, or
the $N^{th}$ scan pulse applied to the first driver is the second scan pulse output from the $N^{th}$ signal transmitter, the $(N-1)^{th}$ scan pulse applied to the second driver is a first scan pulse output from the $(N-1)^{th}$ signal transmitter, and the $N^{th}$ scan pulse applied to the second driver is the first scan pulse output from the $N^{th}$ signal transmitter.

22. The display device of claim 10, wherein:
the gate-on voltage of the first and second scan pulses is lower than both the first gate-off voltage and the second gate-off voltage or is higher than both the first gate-off voltage and the second gate-off voltage; and
the first and second scan pulses are both configured to be supplied to p-type transistors or both configured to be supplied to n-type transistors.

23. The display device of claim 10, wherein the controller further includes a transistor with an electrode connected directly to the VGH1 node.

* * * * *